US006762654B1

(12) United States Patent
Tanaka

(10) Patent No.: US 6,762,654 B1
(45) Date of Patent: Jul. 13, 2004

(54) DELAY LINE

(75) Inventor: Hideaki Tanaka, Takefu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/615,875

(22) Filed: Jul. 13, 2000

(30) Foreign Application Priority Data

Jul. 15, 1999 (JP) .......................................... 11-202294

(51) Int. Cl.⁷ .............................................. H03H 7/30
(52) U.S. Cl. ....................... 333/140; 333/161; 333/162; 333/185
(58) Field of Search ................................. 333/138, 139, 333/140, 156, 161, 162, 163, 185, 167

(56) References Cited

U.S. PATENT DOCUMENTS

| | | | |
|---|---|---|---|
| 3,879,690 A | * 4/1975 | Golant et al. ................ | 333/204 |
| 4,203,081 A | 5/1980 | Brakeckelmann | |
| 5,157,576 A | * 10/1992 | Takaya et al. ............ | 361/321.2 |
| 5,197,170 A | * 3/1993 | Senda et al. ................ | 29/25.42 |
| 5,436,601 A | 7/1995 | Mandai et al. | |
| 5,583,470 A | * 12/1996 | Okubo ......................... | 333/185 |
| 5,985,414 A | * 11/1999 | Fukuda et al. ............... | 333/185 |
| 6,222,430 B1 | * 4/2001 | Horle et al. ................. | 333/204 |

FOREIGN PATENT DOCUMENTS

| | | |
|---|---|---|
| EP | 0675560 A1 | 10/1995 |
| JP | 53-053941 | 10/1976 |
| JP | 54-072443 | 10/1977 |
| JP | 61-199309 | 9/1986 |
| JP | 62-024523 | 2/1987 |
| JP | 3-276612 | 12/1991 |
| JP | 5-055511 | 7/1993 |
| JP | 6-013109 | 2/1994 |
| JP | 6-164289 | 6/1994 |
| JP | 6-216689 | 8/1994 |
| JP | 6-326542 | 11/1994 |
| JP | 10-126191 | 5/1998 |

* cited by examiner

Primary Examiner—Robert Pascal
Assistant Examiner—Kimberly E Glenn
(74) Attorney, Agent, or Firm—Keating & Bennett, LLP

(57) ABSTRACT

A compact, small-size delay line that has excellent flatness in group delay time characteristic and an excellent frequency characteristic, is constructed such that one coil is divided into four inductors, and four stages of LC-π type low pass filters including inductors and capacitors are contained within a laminated body. The inductors are defined by connecting together in series coil conductor patterns arranged in a matrix on insulating sheets provided in the laminated body. Mutually adjacent inductors are arranged so that their coiling directions are opposite to each other. The insulating sheets may be made of non-magnetic material having a dielectric constant of about 15 or lower.

23 Claims, 8 Drawing Sheets

⊗ MAGNETIC FLUX PERPENDICULAR TO THE PAPER SURFACE FROM FRONT FACE TO BACK FACE

⊙ MAGNETIC FLUX PERPENDICULAR TO THE PAPER SURFACE FROM BACK FACE TO FRONT FACE

DELAY LINE

BACKGROUND OF THE INVENTION

1. Field of the Invention

The present invention relates to a delay line, and more particularly, to a delay line for use in delaying a signal such as a digital signal.

2. Description of the Related Art

Conventionally, as a delay line for use in delaying a signal such as a digital signal having a clock frequency of 100 MHz or higher, a lumped constant type LC low pass filter that is constructed by combining an inductor with a capacitor, has been used. Then, by increasing the inductance value and the capacitance value of such an LC low pass filter, it is possible to obtain a longer delay time.

However, with the above-described conventional delay line, by merely increasing the number of windings when forming an inductor in order to increase its inductance value, or merely increasing the areas of capacitive electrodes of a capacitor in order to increase its capacitance value, there will occur a problem that the frequency characteristic (a pulse rise characteristic) of the delay line will be worsened, or a problem that the flatness of a group delay time (waveform deflection characteristic) will be deteriorated.

SUMMARY OF THE INVENTION

In order to overcome the problems described above, preferred embodiments of the present invention provide a compact, very small delay line having an excellent flatness in its group delay time characteristic, and also having an excellent frequency characteristic.

According to one preferred embodiment of the present invention, a delay line includes a coil divided into at least three inductors, and at least three stages of low pass filters including the at least three inductors and a plurality of capacitors, wherein the low pass filters are contained within a laminated body defined by laminating a plurality of insulating layers.

With the above constitution, since each of the inductors and capacitors has only a small inductance value and a small capacitance value, respectively, there is little possibility that a pulse rise characteristic and a flatness of a group delay time of the delay line will be deteriorated. On the other hand, since the delay line as a whole has a large inductance value and a large capacitance value, the delay line achieves a long delay time.

Further, since coil conductor patterns constituting the inductors in each stage of the low pass filters are arranged on the same plane of insulating layers of the laminated body, it is possible to more efficiently arrange the coil conductor patterns within the laminated body.

In the delay line according to preferred embodiments of the present invention, each inductor has a coil axis that is substantially parallel to a laminating direction of the insulating layers, and winding directions of adjacent inductors are opposite to each other.

Moreover, since the insulating layers are preferably made of a dielectric ceramic material having a relative dielectric constant of about 15 or less, a magnetic coupling and an electrostatic coupling between mutually adjacent inductors are greatly reduced. As a result, an undesired surge or increase in a group delay time characteristic is prevented, thus ensuring a flat group delay time characteristic.

In addition, a capacitor connected to an end of at least one of the inductors constituting the low pass filters, and another capacitor connected to another end of the at least one of the inductors, are arranged in different positions in the laminating direction of the insulating layers. In this way, the low pass filter including the inductor and the two capacitors has only a small electrostatic capacitance coupling between the two capacitors, thereby obtaining an even flatter characteristic of a group delay time.

Further, in the delay line according to preferred embodiments of the present invention, a ratio of a vertical dimension to a lateral dimension of the coil conductor pattern is preferably approximately 1. When the coil conductor pattern has a substantially rectangular shape, the coil conductor pattern is defined as substantially a square shape, thereby making it possible to obtain a high Q.

Moreover, in the delay line according to preferred embodiments of the present invention, one end of an inductor of a k stage in the low pass filter and one end of an inductor of a k+1 stage adjacent thereto in the low pass filter are electrically connected to each other on an upper layer of the laminated body, and the other end of the inductor of the k+1 stage in the low pass filter and one end of an inductor of the k+2 stage adjacent thereto in the low pass filter are electrically connected to each other on a lower layer of the laminated body.

Adjacent inductors of adjacent low pass filters are alternately connected on the lower layer and the upper layer of the laminated body, thereby causing the magnetic fluxes of mutually adjacent inductors to be arranged in opposite directions. Due to this unique arrangement, magnetic coupling of the mutually adjacent inductors is greatly reduced, and cross-talk is minimized.

Other features, elements, characteristics and advantages of the present invention will become more apparent from the detailed description of preferred embodiments with reference to the attached drawings.

DETAILED DESCRIPTION OF PREFERRED EMBODIMENTS

Preferred embodiments of a delay line according to the present invention will be described below with reference to the accompanying drawings.

Figure 1:
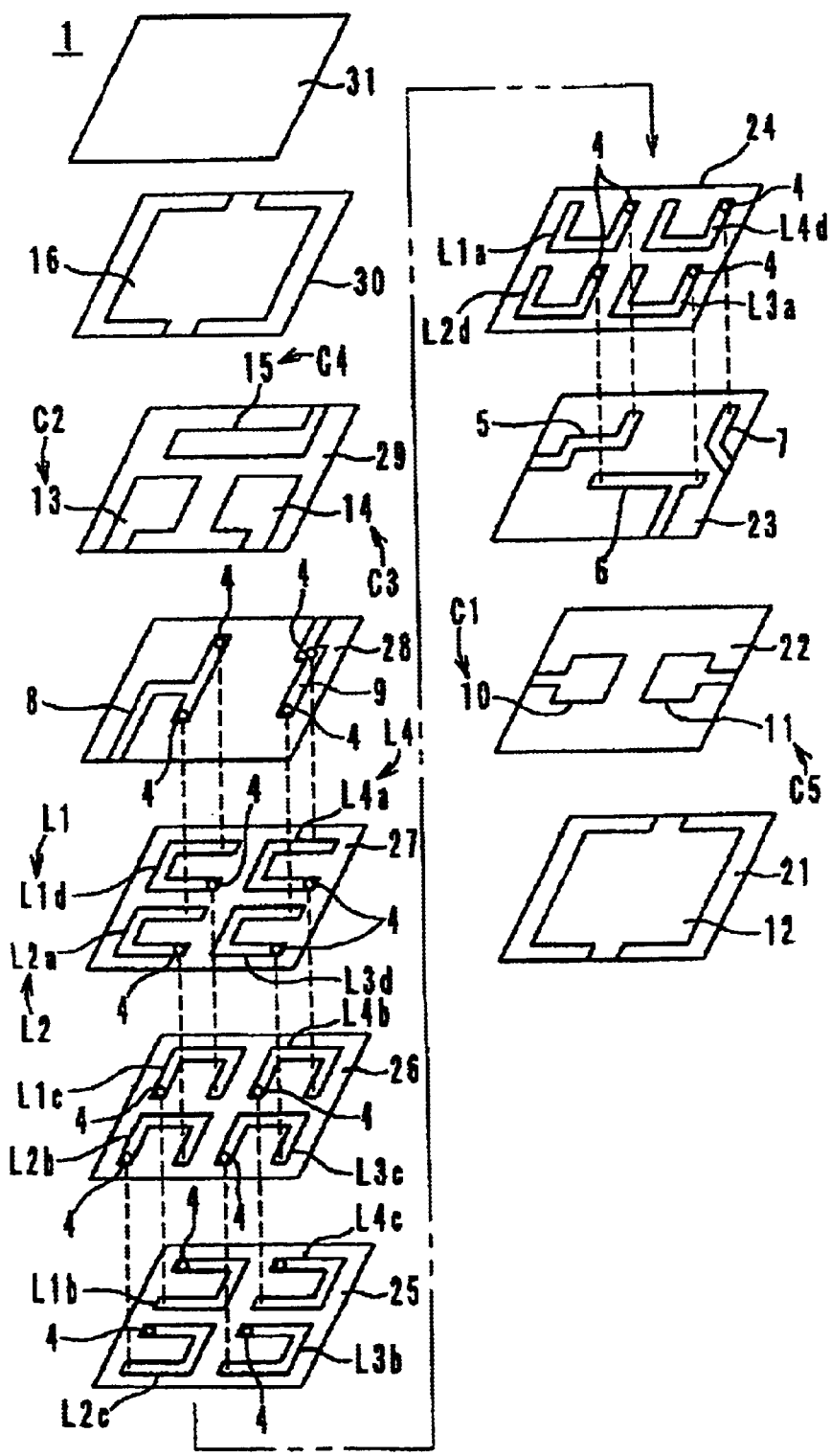
FIG. 1 is an exploded perspective view schematically illustrating a first preferred embodiment of a delay line according to the present invention.
Figure 3:
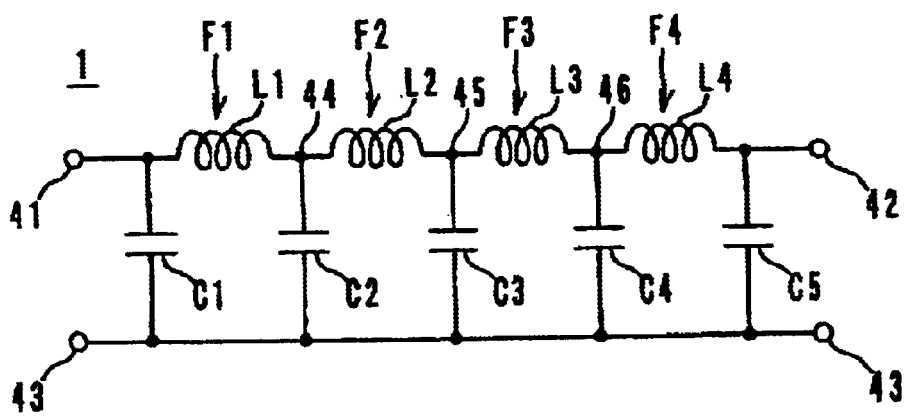
FIG. 3 is an electric equivalent circuit diagram of the delay line shown in FIG. 2.

FIG. 1 is an exploded perspective view indicating a first preferred embodiment of a delay line according to the present invention. The delay line 1 is a monolithic type circuit array (as shown in FIG. 3), in which a coil has been divided preferably into four inductors L1 to L4, and four-stage LC π type low pass filters F1, F2, F3 and F4, including lumped constant inductors L1 to L4 and capacitors C1 to C5.

Inductor L1 includes coil conductor patterns L1a to L1d provided on insulating sheets 24 to 27, and has a plurality of via holes 4 for continuously and successively connecting together the coil conductor patterns L1a to L1d. One end of the coil conductor pattern L1a corresponding to one end of the inductor L1 is connected through a via hole 4 to a connecting pattern 5 provided on an insulating sheet 23. Further, one end of the coil conductor pattern L1d corresponding to the other end of the inductor L1 is connected through a via hole 4 to a connecting pattern 8 provided on an insulating sheet 28.

Inductor L2 includes coil conductor patterns L2a, L2b, L2c and L2d provided respectively on the insulating sheets 27, 26, 25 and 24, and has a plurality of via holes 4 for continuously and successively connecting together the coil conductor patterns L2a to L2d. One end of the coil conductor pattern L2a corresponding to one end of the inductor L2 is connected through a via hole 4 to the connecting pattern 8 provided on the insulating sheet 28. Further, one end of the coil conductor pattern L2d corresponding to the other end of the inductor L2 is connected through a via hole 4 to a connecting pattern 6 provided on the insulating sheet 23.

Inductor L3 includes coil conductor patterns L3a to L3d provided respectively on the insulating sheets 24 to 27, and has a plurality of via holes 4 for continuously and successively connecting together the coil conductor patterns L3a to L3d. One end of the coil conductor pattern L3a corresponding to one end of the inductor L3 is connected through a via hole 4 to the connecting pattern 6 provided on the insulating sheet 23. Further, one end of the coil conductor pattern L3d corresponding to the other end of the inductor L3 is connected through a via hole 4 to a connecting pattern 9 provided on the insulating sheet 28.

Inductor L4 includes coil conductor patterns L4a, L4b, L4c and L4d provided respectively on the insulating sheets 27, 26, 25, 24, and has a plurality of via holes 4 for continuously and successively connecting together the coil conductor patterns L4a to L4d. One end of the coil conductor pattern L4a corresponding to one end of the inductor L4 is connected through a via hole 4 to the connecting pattern 9 provided on the insulating sheet 28. Further, one end of the coil conductor pattern L4d corresponding to the other end of the inductor L4 is connected through a via hole 4 to a connecting pattern 7 provided on the insulating sheet 23.

Then, the coil conductor patterns L1a to L4d are all set such that ratios of a vertical dimension to a lateral dimension are all close to 1, thereby defining substantially square shapes. With this unique construction and arrangement, the inductors L1 to L4 have very high Q values. Nevertheless, it is of course possible that coil conductor patterns L1a through L4d have substantially circular shapes.

The above described inductors L1 to L4 are arranged such that their coil conductor patterns L1a, L2d, L3a and L4d have substantially the same shapes as each other, and are arranged in a matrix array of 2 rows×2 columns on the surface of the insulating sheet 24. Further, other coil conductor patterns preferably have substantially the same shapes and substantially the same positional relationships as those of the coil conductor patterns L1a, L2d, L3a and L4d. In this way, the coil conductor patterns L1a to L4d are efficiently arranged within the delay line 1, thereby making it possible to manufacture a delay line 1 which is very compact in size.

On the other hand, the capacitor C1 includes an insulating sheet 22, a capacitor electrode 10 disposed on the insulating sheet 22, and a capacitor electrode 12 disposed on an insulating sheet 21. The capacitor C2 includes an insulating sheet 30, a capacitor electrode 13 disposed on a sheet 29, and a capacitor electrode 16 disposed on the insulating sheet 30. The capacitor C3 comprises the insulating sheet 30, a capacitor electrode 14 disposed on the sheet 29, and the capacitor electrode 16 disposed on the sheet 30. The capacitor C4 includes the sheet 30, a capacitor electrode 15 disposed on the sheet 29, and the capacitor electrode 16 disposed on the sheet 30. The capacitor C5 includes the sheet 22, a capacitor electrode 11 disposed on the sheet 22, and the capacitor electrode 12 disposed on the sheet 21.

Figure 2:
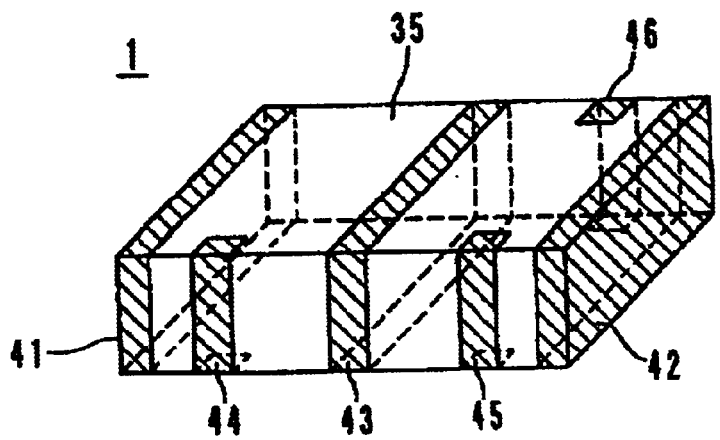
FIG. 2 is a perspective view schematically indicating an outer appearance of the delay line shown in FIG. 1.

Each of the insulating sheets 21 to 31, are stacked on each other, and are sintered together so as to define an integral and monolithic body, thereby providing a laminated body 35 as shown in FIG. 2. An input electrode 41, an output electrode 42 and a ground electrode 43 are respectively arranged on the left end surface, right end surface and approximate central portion of the laminated body 35. Relay electrodes 44, 45 and 46 are provided respectively on the left and right of the front surface of the laminated body 35, and on the right of the back surface of the same laminated body 35.

The input electrode 41 is connected via the connecting pattern 5 to one end (the coil conductor pattern L1a) of the inductor L1, and is also connected to the capacitor electrode 10. The output electrode 42 is connected via the connecting pattern 7 to the other end (the coil conductor pattern L4d) of the inductor L4, and is also connected to the capacitor electrode 11. The ground electrode 43 is connected to the capacitor electrode 12 and to the capacitor electrode 16. The relay electrode 44 is connected via the connecting pattern 8 to the other end (the coil conductor pattern L1d) of the inductor L1 and to one end (the coil conductor pattern L2a) of the inductor L2, further connected to the capacitor electrode 13. The relay electrode 45 is connected via the connecting pattern 6 to the other end (the coil conductor pattern L2d) of the inductor L2 and to one end (the coil conductor pattern L3a) of the inductor L3, further connected to the capacitor electrode 14. The relay electrode 46 is connected via the connecting pattern 9 to the other end (the coil conductor pattern L3d) of the inductor L3 and to one end (the coil conductor pattern L4a) of the inductor L4, further connected to the capacitor electrode 15. FIG. 3 is an electric equivalent circuit diagram of the delay line 1 constructed in the above described manner.

Figure 4:
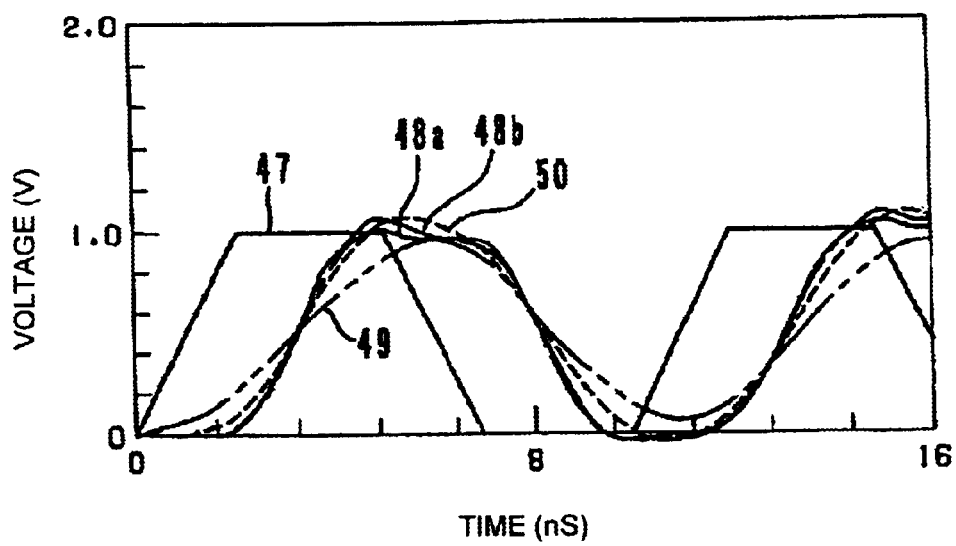
FIG. 4 is a graph indicating a transient response characteristic of the delay line.

Since the delay line 1 is arranged such that one coil has been divided preferably into four inductors L1 to L4, it possible that the inductors L1 to L4 and the capacitors C1 to C5 have only small inductance values and small capacitance values, thereby making it possible to improve the pulse rise characteristic and waveform deflection characteristic of the delay line on the other hand, since the value of the inductance and the value of the capacitance of an entire delay line 1 are all large, it is possible to obtain a relatively long delay time. FIG. 4 is a graph (refer to a solid line 48a) indicating a transient response characteristic at a time when a trapezoidal pulse wave represented by a solid line 47 has been input into the delay line 1 (having a delay time of about 2nS) which includes four LC π type low pass filters F1 to F4. Here, for comparison, the graph includes both a transient response characteristic (refer to a two-dot chain line 49) of a delay line having only one stage LC π type low pass filter and a transient response characteristic (refer to a broken line 50) of a delay line having two-stage LC π type low pass filter. In fact, when using a delay line having only one stage low pass filter or two-stage low pass filter, since a pulse rise characteristic is not good and a distortion in an output waveform is large, such delay lines are difficult to be put into practical use. In contrast to this, the delay line 1 having four low pass filters and having the multiple stage arrangement in preferred embodiments of the present invention, achieves an excellent pulse rise characteristic and only a small distortion in its output waveform.

Further, a magnetic material or a non-magnetic material may be used as a material for the insulating sheets 21 to 31. When a magnetic material is used, the inductance values of the inductors L1 to L4 will become large, thereby making it possible to obtain a long delay time. However, since a magnetic permeability is high, if the inductors L1 to L4 are arranged very close to each other within the laminated body 35, cross-talk caused by magnetic coupling among the inductors L1 to L4 located adjacent to each other will become large, hence deteriorating a flatness (waveform deflection characteristic) of a group delay time of the delay line 1.

In the first preferred embodiment, as a material for forming the insulating sheets 21 to 31, a non-magnetic material is preferably used (for example, a Ba-Al-Si ceramic dielectric material having a dielectric constant of 6 and having magnetic permeability that is almost the same as a magnetic permeability under a vacuum condition). In this manner, even if the inductors L1 to L4 are arranged very close to each other within the laminated body 35, cross-talk between the inductors L1 to L4 located adjacent to each other is prevented. As a result, the flatness of a group delay time of the delay line 1 is not deteriorated.

Figure 5:
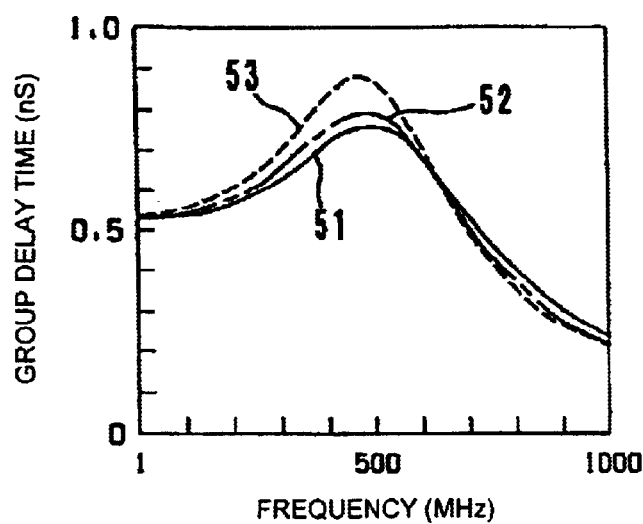
FIG. 5 is a graph indicating a relationship between the group delay time and a frequency, depending on a dielectric constant of an insulating layer.

Here, FIG. 5 shows a simulation result of a relationship between the group delay time and the frequency characteristic of a model obtained when the dielectric constant of a non-magnetic material has been changed to various extents. In practice, the coil conductor patterns L1a to L4d of the inductors L1 to L4 have both their vertical and lateral dimensions set at about 1 mm, and their pattern width at about 150 μm, while an interval distance between coil conductor pattern layers is about 25 μm.

In FIG. 5, a solid line 51 represents that a dielectric constant is 5, one-dot chain line 52 represents that a dielectric constant is 15, a broken line 53 represents that a dielectric constant is 30. As is clear from FIG. 5, if a dielectric constant is 15 or less, only a small surge or increase occurs in the relationship between the group delay time and the frequency characteristic, thereby making it possible to obtain a delay line having a more flat relationship between the group delay time and the frequency characteristic. The reason for this may be explained as follows. When a dielectric constant is low, electrostatic capacitance coupling between various layers of the coil conductor patterns L1a to L4d of the inductors L1 to L4 becomes small. Accordingly, cross-talk characteristics between the layers of coil conductor patterns L1a to L4d are minimized.

Further, in the delay line 1, as shown in FIG. 1, a second end (the coil conductor pattern L1d) of the inductor L1 in the first stage low pass filter F1, and a first end (the coil conductor pattern L2a) of the inductor L2 in the second stage low pass filter F2 are electrically connected with each other via the connecting pattern 8 on the upper layer (the sheet 28) of the laminated body 35. A second end (the coil conductor pattern L2d) of the inductor L2, and a first end (coil conductor pattern L3a) of the inductor L3 in the third stage low pass filter F3 are connected via the connecting pattern 6 on the lower layer (the sheet 23) of the laminated body 35. Further, a second end (the coil conductor pattern 13d) of the inductor L3, and a first end (coil conductor pattern L4a) of the inductor L4 in the fourth stage low pass filter F4 are connected via the connecting pattern 9 on the upper layer (the sheet 28) of the laminated body 35.

Figure 6:
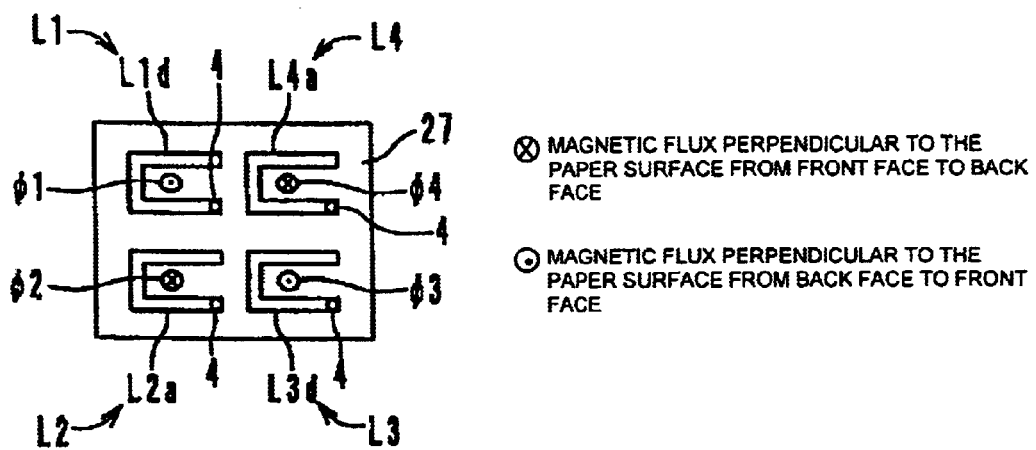
FIG. 6 is a plain view indicating the directions of magnetic fluxes passing through various inductors shown in FIG. 1.

With the above arrangement, the inductors L1 to L4 of the low pass filters F1 to F4 adjacent to each other are connected at connection positions which are alternately located on the upper layer and the lower layer within the laminated body 35. Accordingly, as shown in FIG. 6, the magnetic flux φ1 to φ4 of the inductors L1 to L4 adjacent to each other are arranged in mutually opposite directions. Thus, the mutually adjacent inductors L1 to L4 have only a small magnetic coupling, thus making it possible to further reduce the cross-talk. As a result, it becomes possible to obtain an even flatter relationship between the group delay time and the frequency characteristic.

Figure 7:
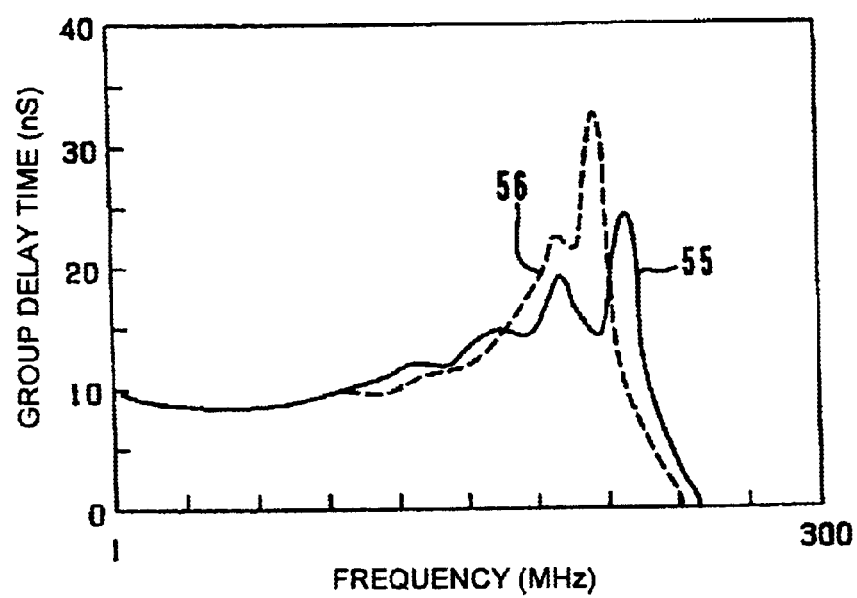
FIG. 7 is a graph indicating a relationship between the group delay time and a frequency, depending on the directions of magnetic fluxes of the inductors.

In addition, as shown in FIG. 7, when the magnetic fluxes φ1 to φ4 of the inductors L1 to L4 adjacent to each other are arranged in mutually opposite directions, a relationship (solid line 55) between the group delay time and the frequency characteristic of the delay line 1 has been greatly improved in its flatness, as compared with a relationship (broken line 56) between the group delay time and the frequency characteristic when the magnetic fluxes φ1 to φ4 of the inductors L1 to L4 adjacent to each other are in the same directions.

Further, in the delay line 1, the capacitor C1 connected on the input side of the inductor L1 of the first stage low pass filter F1, and a capacitor C2 connected on the output side of the inductor L1 are separately arranged on the lower layer and the upper layer of the laminated body 35. Similarly, the capacitor C4 connected on the input side of the inductor L4 of the fourth stage low pass filter F4, and a capacitor C5 connected on the output side of the inductor L4 are separately arranged at the upper layer and the lower layer of the laminated body 35. As a result of this unique configuration, the first stage low pass filter F1 and the fourth stage low pass filter F4 reduce an undesired electrostatic capacitance coupling between the capacitors C1, C4 on the input side and the capacitors C2, C5 on the output side. As a result, a delay line 1 having an even more excellent group delay time characteristic is reliably achieved.

Figure 8:
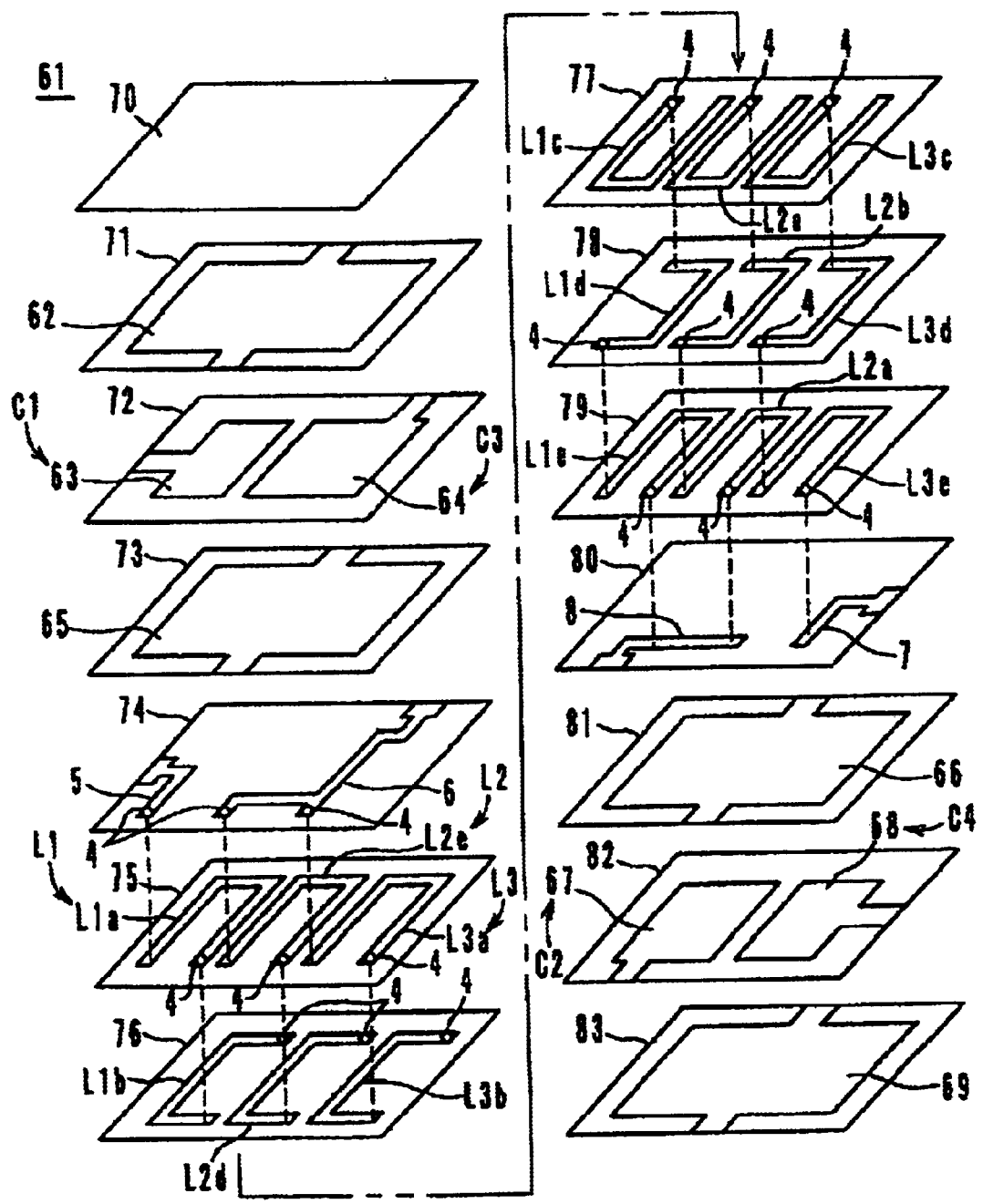
FIG. 8 is an exploded perspective view schematically illustrating a second preferred embodiment of a delay line according to the present invention.
Figure 10:
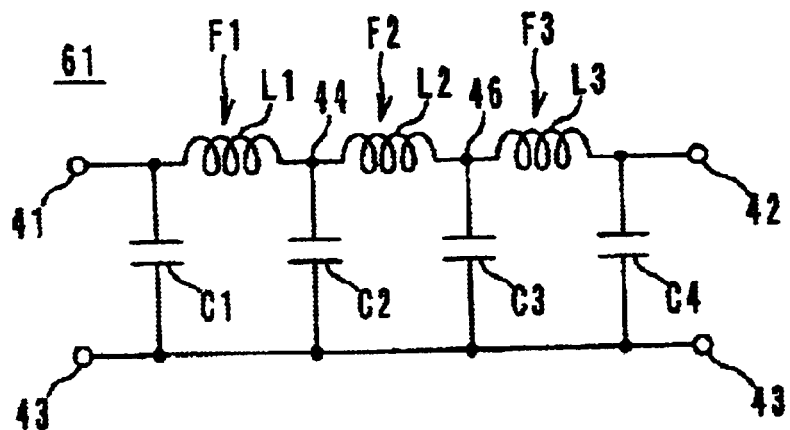
FIG. 10 is an electric equivalent circuit diagram of the delay line shown in FIG. 9.

FIG. 8 is an exploded perspective view illustrating a second preferred embodiment of a delay line according to the present invention. In this delay line 61, one coil has been divided preferably into three inductors L1 to L3, defining a monolithic type circuit array (as shown in FIG. 10) that is a 3-stage circuit including three LC π type low pass filters F1, F2 and F3, including lumped constant inductors L1 to L3 and capacitors C1 to C4.

Inductor L1 includes coil conductor patterns L1a to L1e provided on insulating sheets 75 to 79, respectively, and a plurality of via holes 4 for continuously and successively connecting together the coil conductor patterns L1a to L1e. One end of the coil conductor pattern L1a corresponding to one end of the inductor L1 is connected through the via hole 4 to a connecting pattern 5 provided on an insulating sheet 74. Further, one end of the coil conductor pattern L1e corresponding to the other end of the inductor L1 is connected through the via hole 4 to a connecting pattern 8 provided on an insulating sheet 80.

Inductor L2 includes coil conductor patterns L2a, L2b, L2c, L2d and L2e provided respectively on the insulating sheets 79, 78, 77, 76 and 75, and a plurality of via holes 4 for continuously and successively connecting together the coil conductor patterns L2a to L2e. One end of the coil conductor pattern L2a corresponding to one end of the inductor L2 is connected through a via hole 4 to the connecting pattern 8 provided on the insulating sheet 80. Further, one end of the coil conductor pattern L2e corresponding to the other end of the inductor L2 is connected through a via hole 4 to a connecting pattern 6 provided on the insulating sheet 74.

Inductor L3 includes coil conductor patterns L3a to L3e provided respectively on the insulating sheets 74 to 79, and a plurality of via holes 4 for continuously and successively connecting together the coil conductor patterns L3a to L3e. One end of the coil conductor pattern L3a corresponding to one end of the inductor L3 is connected through a via hole 4 to the connecting pattern 6 provided on the insulating sheet 74. Further, one end of the coil conductor pattern L3e corresponding to the other end of the inductor L3 is connected through a via hole 4 to a connecting pattern 7 provided on the insulating sheet 80.

The above described inductors L1 to L3 are arranged such that their coil conductor patterns L1a, L2e and L3a have substantially the same shapes, and are arranged in a matrix array of 1 row×3 columns on the surface of the insulating sheet 75. Further, other coil conductor patterns preferably have substantially the same shapes and substantially the same positional relationships as those of the coil conductor patterns L1a, L2e and L3a. In this way, the coil conductor patterns L1a to L3e are efficiently arranged within the delay line 1, thereby making it possible to manufacture a delay line 1 which is compact in size.

On the other hand, the capacitor C1 includes insulating sheets 71 and 72, and capacitor electrodes 62, 63 and 65. The capacitor C2 includes insulating sheets 81 and 82, and capacitor electrodes 66, 67 and 69. The capacitor C3 includes insulating sheets 71 and 72, and capacitor electrodes 62, 64 and 65. The capacitor C4 includes the sheets 81 and 82, and capacitor electrodes 66, 68 and 69.

Figure 9:
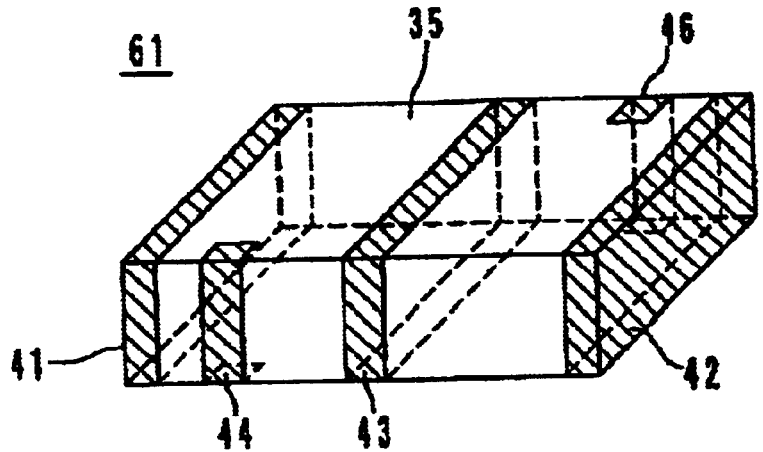
FIG. 9 is a perspective view schematically indicating an outer appearance of the delay line shown in FIG. 8.

The insulating sheets 70 to 83, after having been laminated one upon another, are sintered together so as to define an integral body, thus, a laminated body 35 is obtained as shown in FIG. 9. An input electrode 41, an output electrode 42 and a ground electrode 43 are respectively disposed on the left end surface, right end surface and approximate central portion of the laminated body 35. Relay electrodes 44, 46 are provided respectively on the left of the front surface of the laminated body 35, and on the right of the back surface of the same laminated body.

The input electrode 41 is connected via the connecting pattern 5 to one end (the coil conductor pattern L1a) of the inductor L1, and is also connected to the capacitor electrode 63. The output electrode 42 is connected via the connecting pattern 7 to the other end (the coil conductor pattern L3e) of the inductor L3, and is also connected to the capacitor electrode 68. The ground electrode 43 is connected to the capacitor electrodes 62, 65, 66 and 69. The relay electrode 44 is connected via the connecting pattern 8 to the other end (the coil conductor pattern L1e) of the inductor L1 and to one end (the coil conductor pattern L2a) of the inductor L2, further connected to the capacitor electrode 67. The relay electrode 46 is connected via the connecting pattern 6 to the other end (the coil conductor pattern L2e) of the inductor L2 and to one end (the coil conductor pattern L3a) of the inductor L3, further connected to the capacitor electrode 64. FIG. 10 is an electric equivalent circuit diagram of the delay line 61 obtained in the above described manner.

Since the delay line 61 is arranged such that one coil has been divided preferably into three inductors L1 to L3, the inductors L1 to L3 and the capacitors C1 to C4 have only small inductance values and small capacitance values, therefore the pulse rise characteristic and waveform deflection characteristic of the delay line are greatly improved. On the other hand, since the value of the inductance and the value of the capacitance of an entire delay line 61 are all large, it is possible to obtain a relatively long delay time. In FIG. 4, which is referred to in the description of the first preferred embodiment above, a graph of the second preferred embodiment is also shown. One-dot chain line 48b of FIG. 4 shows a transient response characteristic when a trapezoidal pulse wave represented by a solid line 47 has been input into the delay line 61 (having a delay time of about 2nS) which includes three LC π type low pass filters F1 to F3. It is understood from FIG. 4 that the delay line 61 produces an improved pulse rise characteristic and an improved output waveform characteristic, both of which will not cause any problem in practical use.

Further, in the delay line 61, as shown in FIG. 8, a second end (the coil conductor pattern L1e) of the inductor L1 in the first stage low pass filter F1, and a first end (the coil conductor pattern L2a) of the inductor L2 in the second stage low pass filter F2 are electrically connected with each other via a connecting pattern 8 on the lower layer of the laminated body 35. A second end (the coil conductor pattern L2e) of the inductor L2, and a first end (coil conductor pattern L3a) of the inductor L3 in the third stage low pass filter F3 are connected via the connecting pattern 6 on the upper layer of the laminated body 35.

Figure 11:
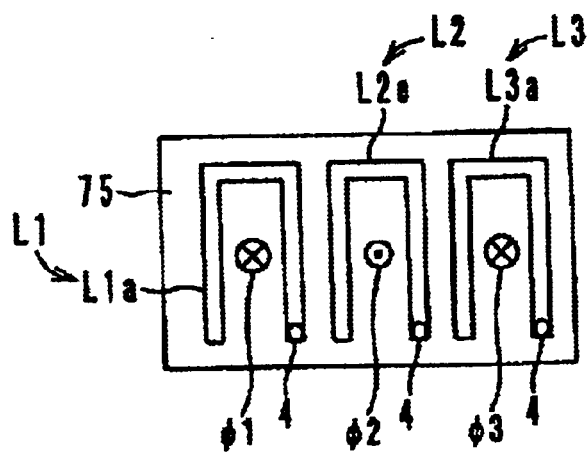
FIG. 11 is a plain view indicating the directions of magnetic fluxes passing through various inductors shown in FIG. 8.

In this way, the inductors L1 to L3 of the low pass filters F1 to F3 adjacent to each other are connected together in which their connecting positions are located alternately on the upper layer and the lower layer of the laminated body 35, the magnetic fluxes φ1 to φ3 of the inductors L1 to L3 adjacent to each other are arranged in mutually opposite directions, as shown in FIG. 11. As a result of this unique configuration and arrangement, the mutually adjacent inductors L1 to L3 have only a small magnetic coupling, thus cross-talk is further reduced. As a result, it becomes possible to obtain an even flatter relationship between the group delay time and the frequency characteristic.

Further, in the delay line 61, the capacitor C1 connected on the input side of the inductor L1 of the first stage low pass filter F1, and a capacitor C2 connected on the output side of the inductor L1 are separately arranged on the upper layer and the lower layer of the laminated body 35. Similarly, the capacitor C2 connected on the input side of the inductor L2 of the second stage low pass filter F2, and a capacitor C3 connected on the output side of the inductor L2 are separately arranged on the lower layer and the upper layer of the laminated body 35. In the same manner, the capacitor C3 connected on the input side of the inductor L3 of the third stage low pass filter F3, and a capacitor C4 connected on the output side of the inductor L3 are separately arranged on the upper layer and the lower layer of the laminated body 35. Accordingly, the first through third stages of low pass filters F1 to F3 greatly reduce an undesired electrostatic capacitance coupling between the capacitors on the input side and capacitors on the output side. As a result, a delay line 61 having even more excellent characteristic of group delay time is reliable achieved.

In the above described preferred embodiments, there have been explained three stages of low pass filters (in the second preferred embodiment) and four stages of low pass filters (in the first preferred embodiment), the present invention should not be limited to these specific preferred embodiments. It is in fact also possible to use an arrangement including more than four stages of low pass filters.

Figure 12:
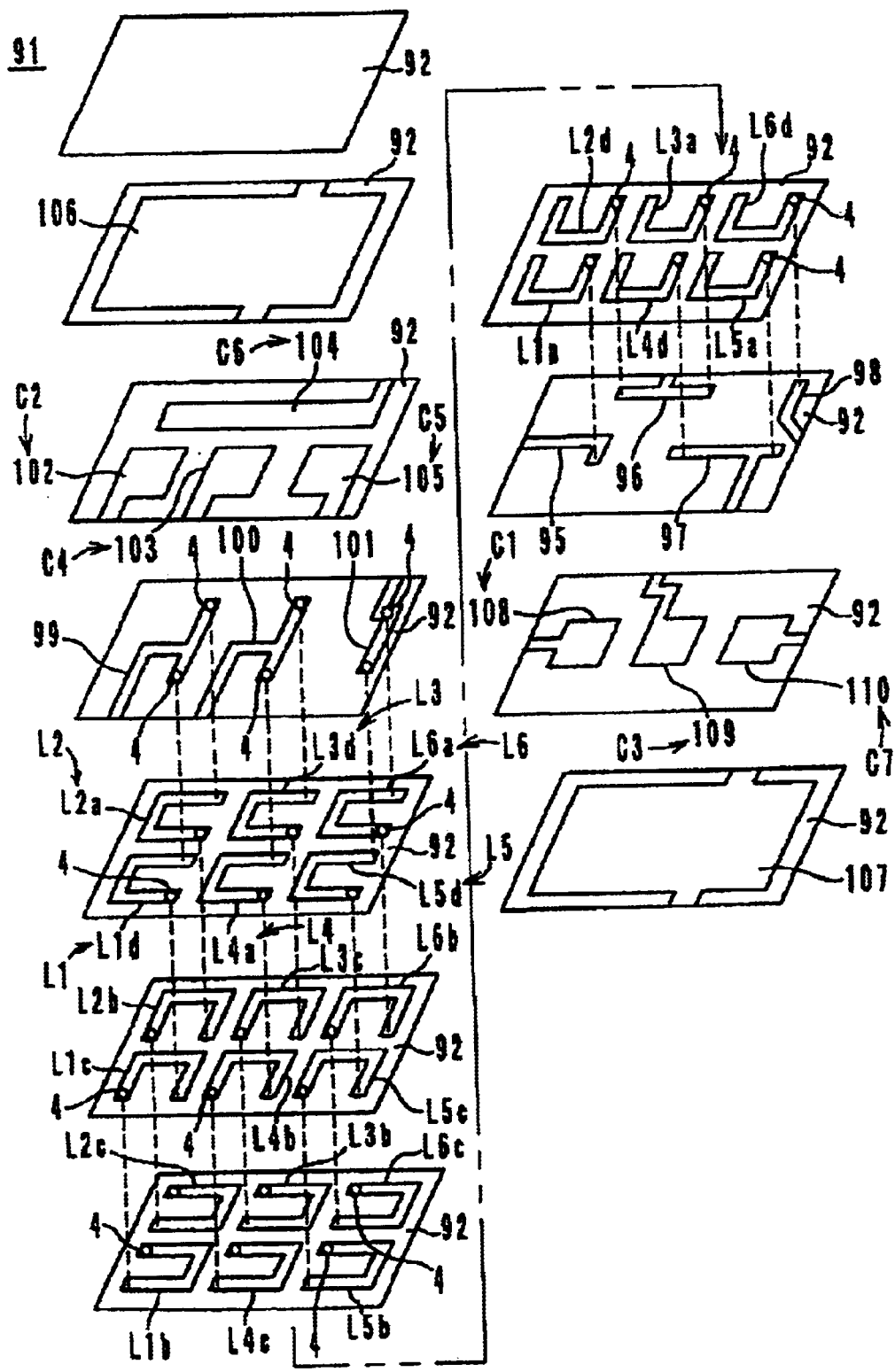
FIG. 12 is an exploded perspective view schematically illustrating another preferred embodiment of a delay line according to the present invention.
Figure 13:
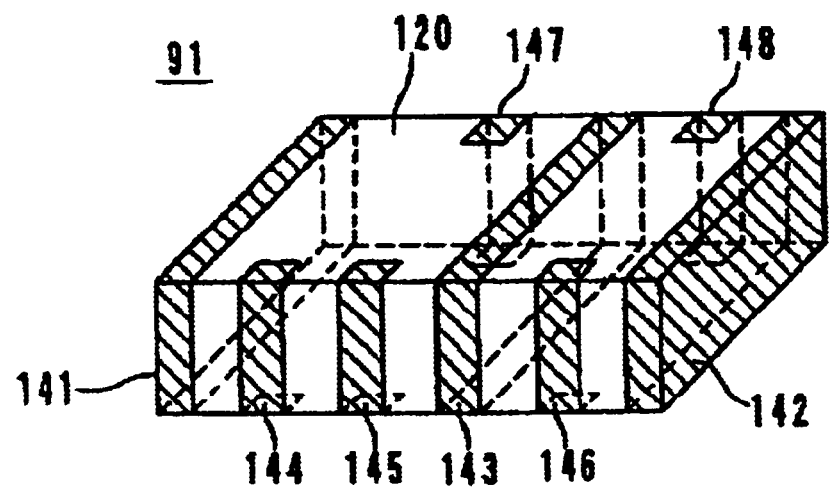
FIG. 13 is a perspective view schematically indicating an outer appearance of the delay line shown in FIG. 12.

For example, as shown in FIG. 12, one coil may be divided into six inductors L1 to L6, forming a delay line 91 which includes six stages of LC π type low pass filters, including inductors L1 to L6 and capacitors C1 to C7. The delay line 91 includes an insulating sheet 92 in which coil conductor patterns L1a to L6d constituting inductors L1 to L6 are provided on the surface of the sheet, an insulating sheet 92 in which capacitor electrodes 102 to 110 are provided on the surface of the sheet, and an insulating sheet 92 in which connecting patterns 95 to 101 are provided on the surface of the sheet. These insulating sheets 92, upon being laminated together one upon another, are sintered into an integral body. Thus, a laminated body 120 is obtained as shown in FIG. 13. After that, on the surface of the laminated body 120 an input electrode 141, an output electrode 142, a ground electrode 143 and relay electrodes 144 to 148 are formed.

Further, in a process of manufacturing a laminated type delay line, insulating sheets are formed to have coil conductor patterns on their surfaces and are laminated one upon another, followed by a sintering treatment so that these insulating sheets are formed into an integral body.

However, a manufacturing method should not be limited by this particular method. It is in fact also possible that the insulating sheets are obtained by a sintering treatment conducted in advance. In addition, it is further possible to manufacture a laminated type delay line with the use of a method that will be explained in the following. Each insulating layer may be made of a paste-like insulating material via printing treatment. Then, the surface of each insulating layer is coated with a paste of electrically conductive material so as to form some coil conductor patterns thereon. After that, the coil conductor patterns are coated with a paste-like insulating material, so as to define an insulating layer with the coil conductor patterns contained therein. Similarly, a coating treatment is repeated successively, so as to define electric connections on necessary positions of the coil conductor patterns, thereby obtaining a delay line having a laminated structure.

As may be understood from the above description, according to the present invention, one coil may be divided into at least three inductors, at least three stages of low pass filters includes the inductors and capacitors, thereby making it possible to greatly reduce the inductance values and the capacitance values of the inductors and the capacitors. Therefore, it is possible with preferred embodiments of the present invention to obtain a very compact, small-size delay line having an excellent flatness for a group delay time characteristic and an excellent pulse rise characteristic.

Further, since the delay line as a whole has a large inductance value and a large capacitance, it is allowed to obtain a long delay time.

Further, a dielectric ceramic material having a dielectric constant of 15 or lower is used as a material for the insulating layers, so that a magnetic coupling and an electrostatic coupling between mutually adjacent inductors are reduced, thereby inhibiting an undesired surge or increase on a group delay time characteristic, thus ensuring a flat characteristic for the group delay time. The mutually adjacent inductors of mutually adjacent low pass filters are alternately connected on the lower layer and the upper layer of the laminated body, and the magnetic fluxes of mutually adjacent inductors are directed in opposite directions. The magnetic coupling of the mutually adjacent inductors are greatly reduced, and the cross-talk is reduced. Therefore, it is possible to make even flatter the characteristic for the group delay time.

Moreover, in the delay line, a capacitor connected to an end of at least one of the inductors constituting the low pass filters, and another capacitor connected to another end in of the at least one of the inductors, are arranged in different positions in the laminating direction of the insulating layers. In this way, the low pass filter including the inductor and the two capacitors has only a small electrostatic capacitance coupling between the two capacitors, thereby obtaining a further flat characteristic of a group delay time.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A delay line comprising:
   at least four inductors; and
   a laminated body including a plurality of insulating layers and at least four stages of low pass filters including said at least four inductors and a plurality of capacitors; wherein
   the insulating layers are made of a dielectric ceramic material having a relative dielectric constant of about 15 or less.

2. The delay line according to claim 1, wherein the at least four inductors are defined by a plurality of coil conductor patterns arranged on the same plane of the insulating layers of the laminated body.

3. The delay line according to claim 1, wherein each of the at least four inductors has a coil axis that is substantially parallel with a laminating direction of the insulating layers of the laminated body, and winding directions of adjacent ones of the at least four inductors are opposite to each other.

4. The delay line according to claim 1, wherein the insulating layers include magnetic material.

5. A delay line comprising:
   at least four inductors; and
   a laminated body including a plurality of insulating layers and at least four stages of low pass filters including said at least four inductors and a plurality of capacitors; wherein
   one of the plurality of capacitors is connected to an end of at least one of the at least four inductors and is located on a first insulating layer, and another of the plurality of capacitors is connected to another end of said at least one of the at least four inductors and is located on a second insulating layer; and an insulating layer having said at least one of the at least four inductors is interposed between the first insulating layer and the second insulating layer.

6. The delay line according to claim 5, wherein the at least four inductors are defined by a plurality of coil conductor patterns arranged on the same plane of the insulating layers of the laminated body.

7. The delay line according to claim 5, wherein each of the at least four inductors has a coil axis that is substantially parallel with a laminating direction of the insulating layers of the laminated body, and winding directions of adjacent ones of the at least four inductors are opposite to each other.

8. The delay line according to claim 5, wherein the insulating layers include magnetic material.

9. The delay line according to claim 5, wherein the coil conductor patterns that define the at least four inductors have the same shape.

10. A delay line comprising:
at least three inductors; and
a laminated body including a plurality of insulating layers and at least three stages of low pass filters including said at least three inductors and a plurality of capacitors; wherein
the at least three inductors are defined by a plurality of coil conductor patterns arranged on the same plane of the insulating layers of the laminated body; and
a ratio of a vertical dimension to a lateral dimension of each of the coil conductor patterns is approximately 1.

11. A delay line comprising:
at least three inductors; and
a laminated body including a plurality of insulating layers and at least three stages of low pass filters including said at least three inductors and a plurality of capacitors; wherein
one end of a first of the at least three inductors of a k stage in the low pass filter and one end of a second of the at least three inductors of a k+1 stage adjacent thereto in the low pass filter are electrically connected to each other on an upper layer of the laminated body, and the second end of the another of the at least three inductors of the k+1 stage in the low pass filter and one end of a third of the at least three inductors of a k+2 stage adjacent thereto in the low pass filter are electrically connected to each other on a lower layer of the laminated body.

12. A delay line comprising:
at least four inductors; and
a laminated body including a plurality of insulating layers and at least four stages of low pass filters including said at least four inductors and a plurality of capacitors; wherein
the at least four inductors are defined by a plurality of coil conductor patterns arranged on the same plane of the insulating layers of the laminated body;
a portion comprising a the coil conductor patterns is interposed between a first portion comprising a at least one of the plurality of capacitors and a second portion comprising another of the plurality of capacitors; and
the insulating layers have a plurality of via holes for connecting the coil conductor patterns that define the at least four inductors.

13. The delay line according to claim 12, wherein the coil conductor patterns that define the at least four inductors have the same shape.

14. The delay line according to claim 12, wherein each of the at least four inductors has a coil axis that is substantially parallel with a laminating direction of the insulating layers of the laminated body, and winding directions of adjacent ones of the at least four inductors are opposite to each other.

15. The delay line according to claim 12, wherein the insulating layers include magnetic material.

16. The delay line according to claim 12, wherein the coil conductor patterns that define the at least four inductors have the same shape.

17. A monolithic circuit array including a delay line comprising:
at least three lumped constant inductors; and
a plurality of insulating layers stacked on each other to define a monolithic laminated body, the laminated body including at least three stages of low pass filters defined by said at least three lumped constant inductors and a plurality of capacitors; wherein
the at least three lumped constant inductors are defined by a plurality of coil conductor patterns arranged on the same plane of the insulating layers of the laminated body; and
a ratio of a vertical dimension to a lateral dimension of each of the coil conductor patterns is approximately 1.

18. The monolithic circuit array according to claim 17, wherein at least three inductors and at least four capacitors are included in the at least three stages of low pass filters.

19. The monolithic circuit array according to claim 17, wherein at least four stages of low pass filters are provided in the monolithic laminated body, and at least four inductors and at least five capacitors are included in the at least four stages of low pass filters.

20. The monolithic circuit array according to claim 17, wherein the insulating layers, are made of a dielectric ceramic material having a relative dielectric constant of about 15 or less.

21. The monolithic circuit array according to claim 17, wherein one of the capacitors is connected to an end of at least one of the inductors, and another of the capacitors is connected to another end of said at least one of the inductors, and the one of the capacitors and the another of the capacitors are located at different positions in a laminating direction of the insulating layers.

22. The monolithic circuit array according to claim 17, wherein the low pass filters are LC $\pi$ type low pass filters.

23. The monolithic circuit array according to claim 17, wherein the number of the plurality of capacitors is greater than the number of the lumped constant inductors.

* * * * *